(12) United States Patent
Ramian et al.

(10) Patent No.: US 12,355,498 B2
(45) Date of Patent: Jul. 8, 2025

(54) MEASUREMENT APPLICATION DEVICE CALIBRATION UNIT, MEASUREMENT SYSTEM, METHOD

(71) Applicant: ROHDE & SCHWARZ GMBH & CO. KG, Munich (DE)

(72) Inventors: Florian Ramian, Karlsfeld (DE); Florian Gerbl, Olching (DE); Daniel Mueller-Remer, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 404 days.

(21) Appl. No.: 17/815,757

(22) Filed: Jul. 28, 2022

(65) Prior Publication Data

US 2024/0039644 A1 Feb. 1, 2024

(51) Int. Cl.
*G01R 35/00* (2006.01)
*G01R 31/28* (2006.01)
*H04B 17/00* (2015.01)
*H04B 17/11* (2015.01)

(52) U.S. Cl.
CPC ......... *H04B 17/11* (2015.01); *G01R 31/2824* (2013.01); *H04B 17/0085* (2013.01)

(58) Field of Classification Search
CPC .............................. H04B 17/21; H04B 17/0085
See application file for complete search history.

(56) References Cited

U.S. PATENT DOCUMENTS

| | | | |
|---|---|---|---|
| 8,508,241 B2 | 8/2013 | Heuermann | |
| 9,111,603 B1* | 8/2015 | Wang | G11C 5/147 |
| 10,805,015 B1 | 10/2020 | Dressel et al. | |
| 10,969,421 B2 | 4/2021 | Anderson et al. | |
| 2012/0109566 A1 | 5/2012 | Adamian | |
| 2013/0076343 A1 | 3/2013 | Carpenter et al. | |
| 2016/0061870 A1* | 3/2016 | Vaculik | G01R 21/133 |
| | | | 702/106 |

(Continued)

OTHER PUBLICATIONS

Ambatali, "Implementation of an Oscilloscope Vector Network Analyzer for Teaching S-Parameter Measurements", IEEE, 2018, 5 pages.

(Continued)

*Primary Examiner* — Dominic E Hawkins
(74) *Attorney, Agent, or Firm* — BROOKS KUSHMAN P.C.

(57) ABSTRACT

The present disclosure provides a measurement application device calibration unit, comprising a coupling element comprising a first connection and a second connection for coupling the coupling element into a signal measurement path, and a third connection, wherein the coupling element is configured to at least one of couple out a signal from the signal measurement path into the third connection, and couple in a signal from the third connection into the signal measurement path, and comprising a signal processing device that is coupled to the third connection of the coupling element and that is configured to receive the predetermined calibration signal when the coupling element couples out a signal from the signal measurement path into the third connection, and to generate a predetermined calibration signal when the coupling element couples in a signal from the third connection into the signal measurement path.

18 Claims, 7 Drawing Sheets

(56) References Cited

U.S. PATENT DOCUMENTS

2017/0257240 A1* 9/2017 Ma .................. H04L 5/0048
2018/0052185 A1* 2/2018 Kniffin ............. G01D 18/008
2018/0372779 A1* 12/2018 Peschke ............ G01R 13/22
2020/0103485 A1 4/2020 Anderson et al.
2022/0200616 A1* 6/2022 Camponeschi ...... H04B 1/0003

OTHER PUBLICATIONS

Perotoni et al., "Conversion of Scattering Parameters to Time-Domain for Imaging Applications: Rules and Examples", Journal of Communication and Information Systems, 2021, p. 62-69, vol. 36, No. 1.

* cited by examiner

MEASUREMENT APPLICATION DEVICE CALIBRATION UNIT, MEASUREMENT SYSTEM, METHOD

TECHNICAL FIELD

The disclosure relates to a measurement application device calibration unit, a measurement system, and a respective method.

BACKGROUND

Although applicable to any measurement system, the present disclosure will mainly be described in conjunction with calibration of vector signal generators and vector signal analyzers.

When performing measurements in electronic applications with e.g., measurement instruments, such as vector signal generators, vector signal analyzers, and oscilloscopes, users have specific requirements concerning the measurement uncertainty, especially the frequency response. Usually, the desired frequency response should deviate from an optimal frequency response as little as possible i.e., the graph showing the frequency response should exactly show the DUT's frequency response, without any influence of the measurement setup.

There exist calibration techniques for calibrating measurement equipment. However, the existing calibration techniques are usually complex to perform and provide a limited calibration quality.

Accordingly, there is a need for providing simplified calibration of measurement equipment.

SUMMARY

The above stated problem is solved by the features of the independent claims. It is understood, that independent claims of a claim category may be formed in analogy to the dependent claims of another claim category.

Accordingly, it is provided:

A measurement application device calibration unit, comprising at least one coupling element comprising a first connection and a second connection for coupling the coupling element into a signal measurement path that is coupled to a measurement application device, and a third connection, wherein the coupling element is configured to at least one of couple out a signal from the signal measurement path into the third connection, and couple in a signal from the third connection into the signal measurement path, and a signal processing device that is coupled to the third connection of the coupling element and that is configured to receive the predetermined calibration signal when the coupling element couples out a signal from the signal measurement path into the third connection, and to generate a predetermined calibration signal when the coupling element couples in a signal from the third connection into the signal measurement path.

Further, it is provided

A measurement system, comprising a measurement application device, a measurement signal path from the measurement application device to a reference plane, and a measurement application device calibration unit configured to at least one of couple out a predetermined calibration signal from the signal measurement path and measure the predetermined calibration signal, and generate a predetermined calibration signal, and couple in the predetermined calibration signal into the signal measurement path, wherein the measurement application device is configured to calibrate the signal measurement path based on the calibration signal measured by the measurement application device calibration unit, or the calibration signal as coupled into the signal measurement path and measured by the measurement application device.

Further, it is provided:

A method, comprising coupling out a predetermined calibration signal from a signal measurement path or generating a predetermined calibration signal, measuring the coupled-out calibration signal when the calibration signal is coupled out, coupling in the predetermined calibration signal into the signal measurement path when the calibration signal is generated, and calibrating the signal measurement path at least one of based on the measured calibration signal when the calibration signal is coupled out, and based on the calibration signal as coupled into the signal measurement path and as acquired by a measurement application device that is coupled to the signal measurement path when the calibration signal is generated.

A measurement in a measurement system may be performed for example, with a vector signal generator and a vector signal analyzer, which may be provided both in the same measurement application device or each as a dedicated measurement application device. It is understood, that in the context of the present disclosure, the term "measurement application device" may refer to any type of signal generating device and signal acquiring device in a measurement application. As mentioned above, a measurement application device may also comprise both, a signal generating device and a signal acquiring device. Possible measurement application devices may comprise, but are not limited to, a vector signal analyzer VSA, a vector network analyzer, VNA, a vector signal generator, VSG, and an oscilloscope.

Prior to performing a measurement with a measurement setup, the user will usually perform a calibration of the measurement setup.

The calibration serves to minimize the influences of the measurement application devices and other components of the measurement setup, like cables and connectors. A calibration usually tries to optimize the frequency response of the measurement instruments with regard to a reference plane. The reference plane may usually be understood as the last element before the DUT of the respective signal path i.e., the signal path on the input side of the DUT and the signal path on the DUT output side.

On the input side of the device under test, DUT, the frequency response refers to the deviation of the desired input signal for the DUT and the signal that is actually fed into the DUT. The frequency response provided by the test setup on the input side of the DUT may be seen as the "unwanted" frequency response. The DUT itself also has a frequency response on the input side, which is the frequency response that is to be measured, ideally with no influence from the other components. On the output side of the DUT, the frequency response refers to the deviation between the measured signal that is measured by the respective measurement receiver and the output signal that actually leaves the DUT. As above, the frequency response provided by the test setup on the output side of the DUT may be seen as the "unwanted" frequency response. The DUT itself also has a frequency response on the output side, which is the frequency response that is to be measured, ideally with no influence from the other components.

There are two components to the above-explained frequency response. First, an inherent frequency response caused by imperfections from a digital waveform representation of the measurement signal to the RF output, or from an RF input at the measurement receiver to a digital representation of the received signal. Second, a mismatch between the DUT and the measurement application device.

Ideally both components are known and corrected.

The present disclosure provides a measurement application device calibration unit and a respective measurement application device that may both be used in a measurement system according to the present disclosure. The measurement application device calibration unit in conjunction with a respective measurement application device allows identifying the inherent frequency response and the mismatch in a single calibration process.

To this end, the measurement application device calibration unit comprises a coupling element and a signal processing device.

The coupling element may comprise a coupler or splitter and may comprise directional properties i.e., like in a directional coupler or in a directional splitter.

The coupling element may be coupled into a signal path between a measurement application device and the DUT or the reference plane via the first and second connections. A third connection of the coupling element serves to couple in a signal into the signal path or couple out a signal from the signal path. The signal path between the measurement application device and the DUT or the reference plane may also be called the signal measurement path. Such a signal measurement path may comprise internal elements of the measurement application device, cables, connectors, and the like.

It is understood, that when calibrating the measurement setup, the DUT will usually not be coupled to the signal measurement path. Instead, respective calibration standards may be coupled to the signal measurement path at the reference plane, as will be explained in more detail below.

The signal processing device of the measurement application device calibration unit may comprise a signal receiver that acquires a predetermined calibration signal that is provided to the signal processing device via the third connection of the coupling element.

The signal processing device, when comprising a signal receiver, may be used to calibrate the source side of the measurement setup i.e., a measurement signal generator as measurement application device, and a signal path from the measurement signal generator to the reference plane or DUT.

In this mode of operation, the signal processing device acquires the calibration signal after it is generated by the measurement signal generator and reflected at the reference plane, when performing a possible calibration of the measurement setup.

In addition, or as alternative, the signal processing device may comprise a signal generator that generates a predetermined calibration signal and provides the generated calibration signal to the third connection of the coupling device. Such a calibration signal will then be coupled into the signal measurement path.

The signal processing device, when comprising a signal generator, may be used to calibrate the measurement side of the measurement setup i.e., a measurement device or signal sink as measurement application device, and the signal path between the reference plane or DUT and the measurement device.

In this mode of operation, the measurement device acquires the calibration signal after it is generated by the signal processing device and reflected at the reference plane, when performing a calibration of a measurement setup.

In the measurement system in both cases the calibration signal may be evaluated after it is received either in the signal processing device or in the measurement application device in order to determine calibration parameters for the measurement system i.e., the measurement application device and the respective signal path.

Calibrating or determining calibration parameters in this regard may refer to determining parameters for correcting a mismatch between a first impedance at the reference plane and a second impedance at the reference plane.

The determined calibration parameters may then be applied during the signal generation by the measurement application device if the measurement application device is a signal source for the test signal in a test setup, or may be applied to the measured signal if the measurement application device is a signal sink or measurement device in a test setup. As indicated above, a single measurement application device may also generate the test signal and acquire an output signal from a DUT.

With the features of the measurement application device calibration unit and the measurement system it is possible to perform a calibration of the respective signal measurement paths with only one signal processing device that either generates a calibration signal or receives a calibration signal. No additional receivers or transmitters are required.

Further embodiments of the present disclosure are subject of the further dependent claims and of the following description, referring to the drawings.

In an embodiment of the measurement application device calibration unit, the signal processing device may comprise a reference receiver when the coupling element couples out a signal from the signal measurement path into the third connection.

In a further embodiment of the measurement application device calibration unit, the signal processing device may comprise a reference signal generator when the coupling element couples in a signal from the third connection into the signal measurement path.

In another embodiment, the measurement application device calibration unit may comprise two signal processing devices, one with a reference receiver and one with a reference signal generator, or a single signal processing device with a reference receiver and a reference signal generator. In such an embodiment, two coupling elements may also be provided. The measurement application device calibration unit may, therefore, be used on the DUT input side and the DUT output side.

As explained above, the measurement application device calibration unit may be used on both sides of a DUT i.e., on the input side of a DUT and on the output side of a DUT.

When used in the input side of the DUT, a measurement signal source is present in the form of a respective measurement application device, like a vector signal generator. The calibration signal may be generated by the measurement signal source and will then be reflected at the reference plane.

In such embodiments, the signal processing device may comprise a reference receiver that receives the reflected calibration signal via the coupling element. The term "reference receiver" refers to the fact that the electrical parameters of the reference receiver, like the frequency response of the reference receiver, are well known and that the reference receiver is only used for calibration. This allows taking the characteristics of the reference receiver into account when determining the impedance mismatch such that the reference receiver will only introduce minimal inaccuracies. How such inaccuracies may further be reduced, will be explained in more detail below.

When used on the output side of the DUT a measurement device will usually be provided in the form of a respective measurement application device, like a vector network analyzer or an oscilloscope. In such applications, the calibration signal may not be generated by the measurement application device.

Consequently, the signal processing device may comprise a reference signal generator that inputs the calibration signal into the signal measurement path via the coupling element. The calibration signal will then be reflected at the reference plane and may be measured by the measurement application device.

The term "reference signal generator" refers to the fact that the electrical parameters of the reference signal generator, like the frequency response of the reference signal generator, are well known and that the reference signal generator is only used for calibration. This allows taking the characteristics of the reference receiver into account when determining the impedance mismatch such that the reference signal generator will only introduce minimal inaccuracies. How such inaccuracies may further be reduced, will be explained in more detail below.

In embodiments, the measurement application device calibration unit may comprise two sections, a first section for calibrating the input side to a DUT in a measurement setup, and a second section for calibrating the output side of the DUT in a measurement setup. In such embodiments, each section may comprise a dedicated coupling element, and a dedicated signal processing element.

In yet another embodiment of the measurement system the measurement application device calibration unit may comprise a coupling element comprising a first connection and a second connection for coupling the coupling element into the signal measurement path, and a third connection. The coupling element may be configured to at least one of couple out a signal from the signal measurement path into the third connection, and couple in a signal from the third connection into the signal measurement path. In such an embodiment, the signal processing device may be coupled to the third connection of the coupling element and may be configured to receive the calibration signal when the coupling element couples out a signal from the signal measurement path into the third connection, and to generate a calibration signal when the coupling element couples in a signal from the third connection into the signal measurement path.

It is understood, that the measurement system may comprise a measurement application device calibration unit according to any of the embodiments of the measurement application device calibration unit described herein.

In another embodiment, the measurement application device may comprise a measurement signal generator that may be coupled to the signal measurement path when the measurement application device calibration unit couples out the predetermined calibration signal from the signal measurement path.

In yet another embodiment, the measurement application device may comprise a measurement signal receiver that may be coupled to the signal measurement path when the measurement application device calibration unit couples in the predetermined calibration signal into the signal measurement path.

In another embodiment, the measurement application device may comprise a measurement signal generator and a measurement signal receiver.

Above the two modes of operation for the measurement system are described, one mode where the calibration is performed on the input side of the DUT, and one mode where the calibration is performed on the output side of the DUT.

When calibrating the input side of the DUT, a signal generator is present in the measurement application device. Of course, that signal generator may be used to generate the calibration signal, which may then be acquired by the signal processing device of the measurement application device calibration unit after being reflected at the reference plane.

When calibrating the measurement setup on the output side of the DUT with respect to the reference plane, no signal generator is present in the measurement application device but a measurement signal receiver is present. Of course, that measurement signal receiver may be used to acquire the calibration signal that is generated by the signal processing device of the measurement application device calibration unit and reflected at the reference plane.

In a further embodiment, when calibrating, the measurement application device may be configured to determine a mismatch between a first impedance and a second impedance. In embodiments, the first impedance may comprise an impedance from the reference plane towards the DUT, and the second impedance may comprise an impedance from the reference plane towards the measurement application device.

The first impedance refers to the impedance that is present when looking from the reference plane towards the DUT. The second impedance, in contrast, refers to the impedance the is present when looking from the reference plane towards the measurement application device.

When both impedances are the same, no mismatch is present and there is no need for correcting any mismatch. However, if the first impedance and the second impedance are different, the data that is measured in the measurement setup has to be corrected accordingly.

In an embodiment, the measurement system may comprise three different calibration standards. The measurement application device may be configured to determine S-parameters of an error network of the signal measurement path while the three different calibration standards are consecutively coupled to the signal measurement path at the reference plane.

S-parameters, also called scattering parameters, are a well-known method of characterizing the electrical behavior of a linear electric network.

As will be explained below, three different conditions need to be provided to calculate the S-parameters for the signal measurement path. These three different conditions may be provided by consecutively coupling different calibration standards to the signal measurement path at the reference plane.

It is understood, that the different calibration standards may manually be couple to the signal measurement path. As alternative, an automatic calibration standard may be used that controllably couples the required calibration standard to the reference plane.

In a further embodiment, the measurement application device may be configured to set one of the S-parameters to 1.

One of the S-parameters, usually called $S21$, for the one port input side of the DUT may be set to 1, since the reflection measurement also comprises the signal traveling towards the reference plane or DUT.

This results in the error model only comprising three different error parameters or error terms. These error terms may refer to directivity, source match, and reflection tracking. Consequently, three unknown variables need to be determined. A 2-port error network describing a correction of a 1-port measuring device may be used. The error network has 2 ports, because it has an input port and an output port, where the measurement device terminates the chain and, thus, only has 1 port, because the virtual second port can be assumed as the digital side.

To this end, three measurements may be performed with three different calibration standards which provide three different measurement conditions and allow filling in the variables in the respective system of equations.

In another embodiment, the three different calibration standards may comprise an open calibration standard, and a short calibration standard, and a matched calibration standard.

The so called OSM calibration standards, also called Open, Short, and Match calibration standards, are well known and widely available. Of course, any other three different types of calibration standards with known electrical properties may also be used.

In an embodiment, the measurement system may comprise an active calibration standard that is couplable to the reference plane and that is configured to generate a predetermined known calibration signal and input the known calibration signal into the signal path at the reference plane. The measurement application device may be configured to determine a transmission parameter for the signal path from the reference plane to the measurement application device calibration unit based on the known calibration signal and stored information about the known calibration signal, and the measurement application device may be configured to take into account the transmission parameter when calibrating the signal measurement path.

In contrast to the standard OSM-calibration mentioned above where only a product of two S-parameters, usually S12×S21, is determined, with the active calibration standard, it is possible to determine each one of the S-parameters of the product independently. In this context, the S-parameters refer to the S-parameters of the 2-port error model and not to the S-parameters of the DUT.

The active calibration standard by providing a known calibration signal allows calibrating the signal path between the reference plane in the measurement system and the measurement unit in the measurement application device calibration unit for example, the signal processing device of the measurement application device calibration unit.

With the active calibration standard, the transmission parameter for the signal path from the reference plane to the measurement application device calibration unit may be determined in advance to performing the calibration of the signal measurement path with the above-mentioned calibration standards. This will improve the quality of the calibration of the measurement system since the influence of the measurement application device calibration unit may be eliminated from the calibration of the signal measurement path with this additional calibration step.

The active calibration standard may be any type of signal generator that may be coupled to the reference plane. The only requirement regarding the active calibration standard is that it needs to generate the predetermined known calibration signal with predetermined characteristics that must be known on the receiving side.

The stored information about the calibration signal may for example comprise information about at least one of the amplitude and the phase of the known calibration signal. Such information may be provided once for the full known calibration signal or separately for different frequency ranges of the known calibration signal.

As alternative, the stored information may also comprise a full description of the known calibration signal. Such a full description may comprise samples of a time line or a time-domain waveform of the known calibration signal with a predetermined resolution. Alternatively, such a full description may comprise samples or description of a waveform of the known calibration signal in the frequency domain.

The active calibration standard may in embodiments comprise a comb generator. A comb generator is a special kind of signal generator that produces a signal with multiple harmonics to a base signal. The output signal of such a comb generator when shown in the frequency range shows a pattern that is similar to teeth of a comb, hence the name comb generator. The advantage of using a comb generator is that the known calibration signal may be provided over a large frequency range.

In embodiments, the bandwidth of the active calibration standard may be chosen to be at least as large as the bandwidth of the measurement application device.

It is understood, that the measurement unit in the measurement application device calibration unit for example, the signal processing device with a reference receiver, not necessarily needs to have the same measurement bandwidth as the known calibration signal or the measurement application device. Instead, in embodiments, the measurement unit may have a smaller bandwidth. Signal stitching may in such cases be applied. For example, a band-pass filter may be applied to the known calibration signal before comparing the known calibration signal to the signal as measured by the measurement unit. Such a band-pass filter may comprise the same bandwidth as the measurement unit.

By comparing the known calibration signal as received by the measurement unit in the measurement application device calibration unit with the information about the known signal, the transmission parameter may easily be determined for example by the measurement application device. It is understood, that alternatively, the transmission parameter may also be determined in any other adequate unit that may be present in the measurement system.

Determining the transmission parameter may for example be performed by comparing the known calibration signal as received by the measurement unit in the frequency domain with the samples or description of a waveform of the known calibration signal in the frequency-domain.

After determining the transmission parameter for the signal path from the reference plane to the measurement application device calibration unit, this transmission parameter may be taken into account, when calibrating the measurement system as described above with different calibration standards.

In another embodiment, the measurement system may comprise an active calibration standard that is couplable to the reference plane and that is configured to receive a predetermined known calibration signal. The measurement application device may be configured to determine a transmission parameter for the signal path from the reference plane to the measurement application device calibration unit based on the known calibration signal as received by the active calibration standard and stored information about the active calibration standard, and the measurement application device may be configured to take into account the transmission parameter when calibrating the signal measurement path.

Opposed to the embodiments where the active calibration standard is a signal generator, in other embodiments the active calibration standard may be a signal receiver or signal sink and may receive the known calibration signal. The active calibration standard as a signal receiver or signal sink may especially be used with the signal processing device that generates the predetermined calibration signal, and a measurement application device that measures the calibration signal.

The active calibration standard by receiving a known calibration signal allows calibrating the signal path between the reference plane in the measurement system and the signal generation unit in the measurement application device calibration unit for example, the signal processing device of the measurement application device calibration unit with a reference signal generator.

With the active calibration standard as signal receiver or signal sink, the transmission parameter for the signal path from the reference plane to the measurement application device calibration unit may be determined in advance to performing the calibration of the signal measurement path with the above-mentioned calibration standards on the output side of the DUT. This will improve the quality of the calibration of the measurement system since the influence of the measurement application device calibration unit may be eliminated from the calibration of the signal measurement path with this additional calibration step.

The active calibration standard may be any type of signal receiver or signal sink that may be coupled to the reference plane. The only requirement regarding the active calibration standard is that the electrical characteristics of the signal receiver or signal sink must be known.

The stored information about the active calibration standard may for example comprise information about at least one of an amplitude error and a phase error of the active calibration standard. The information may for example be provided in the form of a frequency response of the active calibration standard or transmission parameters of the active calibration standard.

In embodiments, the bandwidth of the active calibration standard may be chosen to be at least as large as the bandwidth of the measurement application device.

It is understood, that the measurement unit in the signal processing device not necessarily needs to have the same measurement bandwidth as the known calibration signal or the measurement application device. Instead, in embodiments, the measurement unit may have a smaller bandwidth. Signal stitching may be applied. For example, a band-pass filter may be applied to the known calibration signal before comparing the known calibration signal to the signal as measured by the active calibration standard. Such a band-pass filter may comprise the same bandwidth as the measurement unit of the active calibration standard.

By comparing the known calibration signal as received by the measurement unit in the active calibration standard with the information about the known signal, the transmission parameter may easily be determined for example by the measurement application device. It is understood, that alternatively, the transmission parameter may also be determined in any other adequate unit that may be present in the measurement system.

Determining the transmission parameter may for example be performed by comparing the known calibration signal as received by the measurement unit in the frequency domain with the samples or description of a waveform of the known calibration signal in the frequency-domain and taking into account the stored information.

After determining the transmission parameter for the signal path from the reference plane to the measurement application device calibration unit, this transmission parameter may be taken into account, when calibrating the measurement system as described above with different calibration standards.

In a further embodiment, the measurement system may comprise a first measurement application device calibration unit configured to couple out a predetermined calibration signal from a first signal measurement path and measure the predetermined calibration signal, a first measurement application device configured to calibrate the first signal measurement path based on the calibration signal measured by the measurement application device calibration unit. In addition, the measurement system may comprise a second measurement application device calibration unit configured to generate a predetermined second calibration signal and couple in the generated second calibration signal into a second signal measurement path, and a second measurement application device configured to calibrate the second signal measurement path based on the second calibration signal as coupled into the signal measurement path and measured by the measurement application device, The first signal path may be a DUT input-side signal path, and the second signal path may be a DUT output-side signal path.

With this arrangement, the measurement system is provided with two sections, one on the input side of the DUT and one on the output side of the DUT. This configuration, therefore, allows fully calibrating a measurement system to perform measurements on a DUT.

It is understood, that the DUT input-side signal path refers to a signal path between the measurement application device that during normal operation generates a test signal that is transmitted to the DUT and the DUT. In contrast, the DUT output-side signal path refers to a signal path between the DUT and the measurement application device that during normal operation receives the signal as provided by the DUT.

It is understood, that the measurement application device and the measurement application device calibration unit may comprise any required or adequate component for performing any of the functions described in this disclosure.

When implemented as a signal source or signal generator, the measurement application device may for example comprise respective signal generation elements, like oscillators, amplifiers, attenuators, filters, and digital-to-analog converters. The measurement application device may for example comprise a signal generation section that comprises a digital processing element coupled to a digital-to-analog converter that may be coupled to a respective analog signal modification section. Such an analog signal modification section may for example comprise at least one of amplifiers, attenuators, filters, and connectors.

The same applies to the measurement application device being implemented as a signal sink or signal measurement device. Such a measurement application device may for example comprise respective signal acquisition elements, like analog-to-digital converters, amplifiers, attenuators, and filters. The measurement application device may for example comprise a signal acquisition section that comprises an analog acquisition section that is coupled to an analog-to-digital converter and a digital processing element. The analog acquisition section may for example comprise at least one of connectors, amplifiers, attenuators, and filters.

It is understood, that the measurement application device may comprise further elements, like a user interface with a display and user input means e.g., buttons, (rotary-) knobs, a touchscreen, a mouse, or a keyboard, and other elements, like communication interfaces. The measurement application device may for example be provided as a vector network analyzer, a vector signal generator, or an oscilloscope.

The functions described in this disclosure that at least in part require determining values based on other values or performing calculations may be implemented at least in part in the above-mentioned digital processing element. These functions may comprise, but are not limited to, performing the calibration e.g., calculating calibration parameters, determining a mismatch between a first impedance and a second impedance, calculating the impedances based on a measured signal, and determining S-parameters.

Although, some functions may be described in this disclosure as being implemented by a dedicated device, for example the measurement application device or the measurement application device calibration unit, it is understood, that these functions may also be performed in another device. Especially, functions that are performed in the digital domain, like the above-mentioned functions, may be performed by any capable device, while the required digital data may be exchanged between the respective devices via digital data interfaces, like a network interface, a Bluetooth interface, a USB interface, a bus interface, or any other digital interface that serves for communicatively coupling digital devices.

A digital processing element according to the present disclosure may be provided as a dedicated processing element, like a processing unit, a microcontroller, a field programmable gate array, FPGA, a complex programmable logic device, CPLD, or the like. The digital processing element may at least in part also be provided as a computer program product comprising computer readable instructions that may be executed by a processing element. In a further embodiment, the digital processing element may be provided as addition or additional function or method to the firmware or operating system of a processing element that is already present in the respective application as respective computer readable instructions. Such computer readable instructions may be stored in a memory that is coupled to or integrated into the processing element. The digital processing element may load the computer readable instructions from the memory and execute them.

In addition, it is understood, that any required supporting or additional hardware may be provided like e.g., a power supply circuitry and clock generation circuitry.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which.

In the figures like reference signs denote like elements unless stated otherwise.

DETAILED DESCRIPTION OF THE DRAWINGS

Figure 1:
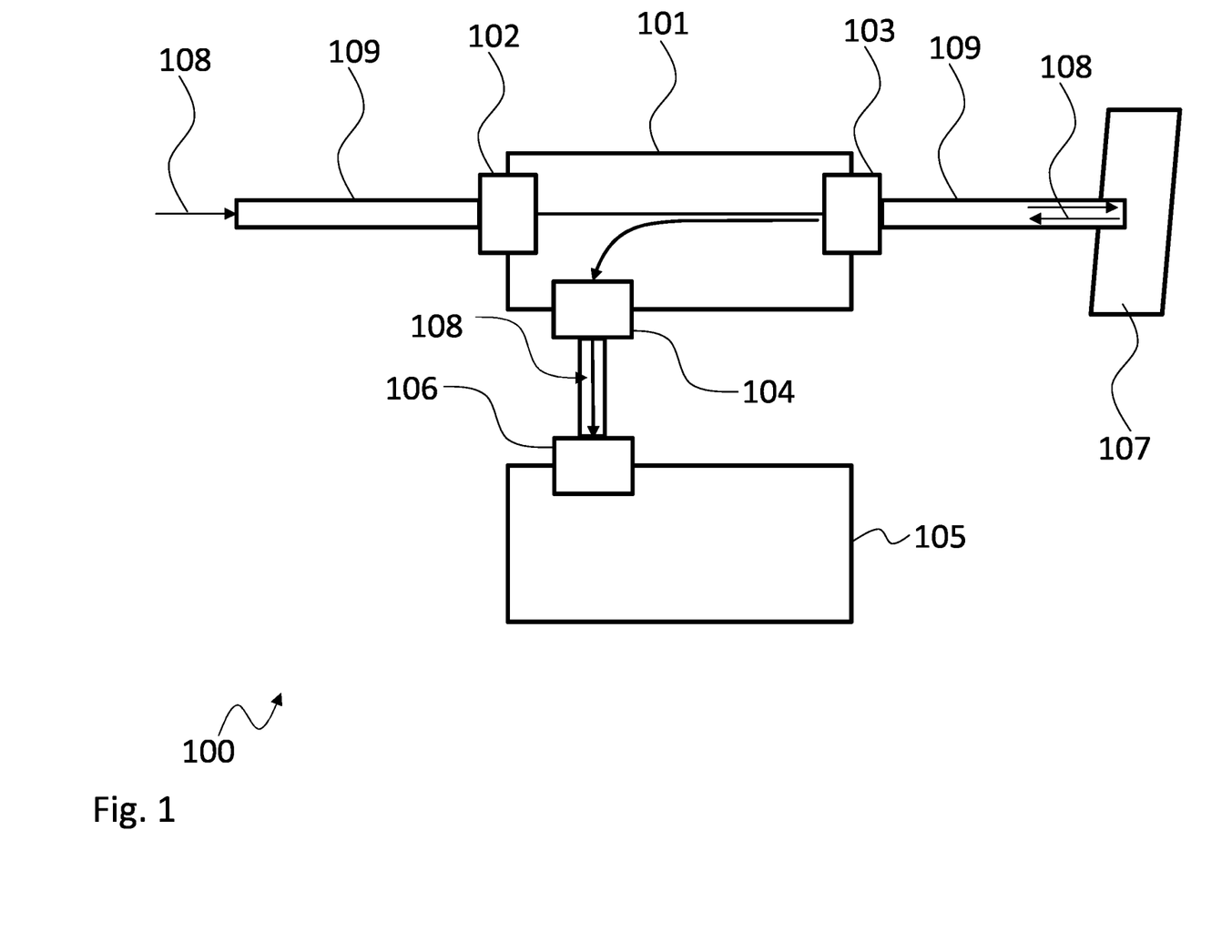
FIG. 1 shows a block diagram of an embodiment of a measurement application device calibration unit according to the present disclosure.

FIG. 1 shows a measurement application device calibration unit 100 that serves for calibrating a DUT input side of a measurement setup i.e., the side that provides a test signal to the DUT when the test is performed.

The measurement application device calibration unit 100 comprises a coupling element 101 that comprises a first connector 102, a second connector 103 and a third connector 104. The third connector 104 is coupled to a connector 106 of a signal processing device 105. The first connector 102 and the second connector 103 are coupled in a signal path 109. The signal path 109 may transport a calibration signal 108 from a calibration signal source (see FIG. 3) to the reference plane 107. To this end, the signal path 109 may comprise for example, cables and connectors.

The calibration signal 108 will be reflected at the reference plane 107, and the coupling element 101 will couple out the reflected calibration signal 108 and provide the calibration signal 108 to the signal processing device 105.

For receiving the reflected calibration signal 108 from the coupling element 101 the signal processing device 105 may for example comprise a respective reference receiver.

As explained in the present disclosure, the measurement application device calibration unit 100 may be used in a measurement system (see FIGS. 3-5) to perform a calibration of the measurement system prior to performing a measurement with a DUT.

To this end, the measurement application device calibration unit 100 may comprise a processing element for example, in the signal processing device 105, that may determine the calibration parameters for the signal path 109. Alternatively, the calibration parameters may be determined in a measurement application device.

For determining the calibration parameters for the signal path 109, different calibration standards may be coupled to the signal path 109 at the reference plane 107, as will be explained in more detail in conjunction with FIGS. 3 and 5.

Figure 2:
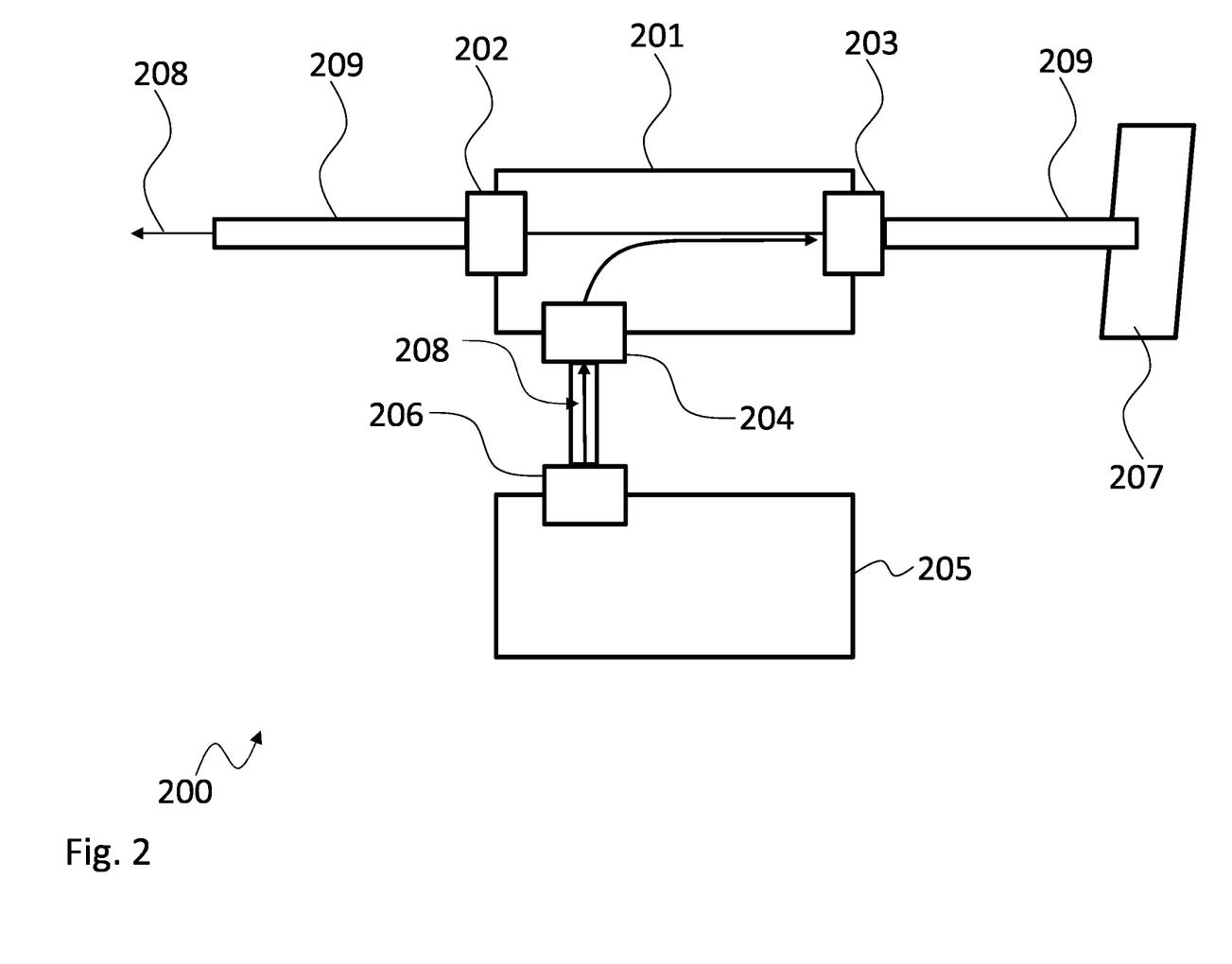
FIG. 2 shows a block diagram of another embodiment of a measurement application device calibration unit according to the present disclosure.

FIG. 2 shows a measurement application device calibration unit 200 that serves for calibrating a DUT output side of a measurement setup i.e., the side that receives a test signal from the DUT when the test is performed.

The measurement application device calibration unit 200 comprises a coupling element 201 that comprises a first connector 202, a second connector 203 and a third connector 204. The third connector 204 is coupled to a connector 206 of a signal processing device 205. The first connector 202 and the second connector 203 are coupled in a signal path 209.

In the measurement application device calibration unit 200, the signal processing device 205 provides the calibration signal 208, that is coupled into the signal path 209 by the coupling element 201 in the direction of the reference plane 207 for example with a reference signal generator.

The calibration signal 208 will be reflected at the reference plane 207, and will travel back through the signal path 209.

The reflected calibration signal 208 may then be acquired by a measurement application device that comprises a signal sink, like a Network Vector Analyzer.

As explained in the present disclosure, the measurement application device calibration unit 200 may be used in a measurement system (see FIGS. 4-5) to perform a calibration of the measurement system prior to performing a measurement with a DUT.

To this end, the measurement application device calibration unit 200 may comprise a processing element for example, in the signal processing device 205, that may determine the calibration parameters for the signal path 209. Of course, such a processing element may also be provided in the respective measurement application device.

For determining the calibration parameters for the signal path 209, different calibration standards may be coupled to the signal path 209 at the reference plane 207, as will be explained in more detail in conjunction with FIGS. 4-5.

Figure 3:
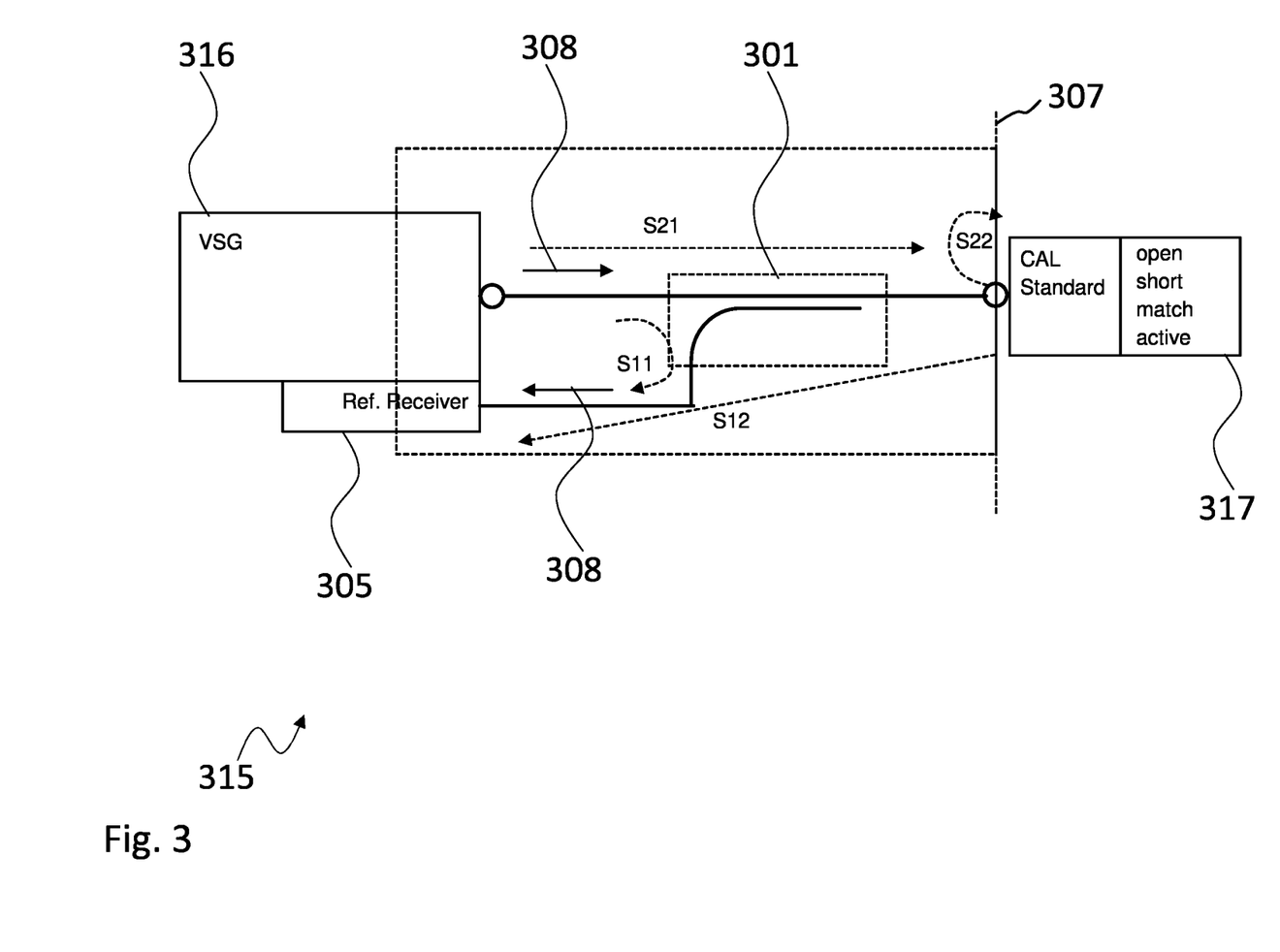
FIG. 3 shows a block diagram of an embodiment of a measurement system according to the present disclosure.

FIG. 3 shows a block diagram of a measurement system 315.

The measurement system 315 comprises a measurement application device calibration unit like the measurement application device calibration unit 100 with a coupling element 301 coupled into a measurement signal path and coupled to a reference receiver 305 as signal processing device. The measurement signal path is arranged between a vector signal generator 316 as measurement application device and a reference plane 307. At the reference plane 307 the measurement system 315 comprises a calibration standard 317.

In the shown example, the calibration standard 317 may be an automatically switchable calibration standard 317 that may provide different terminations at the reference plane 307. The calibration standard 317 may provide an open termination, a short termination, a match termination, and an active termination. Of course, in other embodiments, dedicated calibration standards may be provided at least for some of the terminations, and other terminations than open, short and match may be used.

In an exemplary embodiment, the measurement signal path may be calibrated by first activating the active termination of the calibration standard 317. In this mode, the calibration standard 317 may provide a predetermined known calibration signal 308. As explained above, in embodiments, the predetermined known calibration signal 308 may be a comb signal generated by a comb generator in the calibration standard 317.

The known calibration signal 308 will then be received by the reference receiver 305 and may be evaluated to determine the transmission characteristics of the signal path from the reference plane 307 to the reference receiver 305.

Since the characteristics of the known calibration signal 308 are known in detail, any deviation between the known calibration signal 308 as received by the reference receiver 305 and the original known calibration signal as it should be received may be determined. Based on the identified differences, the transmission characteristics of the signal path from the reference plane 307 to the reference receiver 305 may be determined.

After performing this first calibration step, in a second calibration step, the signal path between the reference plane 307 and the vector signal generator 316 may be calibrated.

This calibration may be performed by generating a respective calibration signal 308 in the vector signal generator 316 and outputting the calibration signal 308 into the signal path. The calibration signal 308 will then be reflected at the reference plane 307. The reflection of the calibration signal 308 will then be received by the reference receiver 305 via the coupling element 301.

Measurements for the second calibration may be performed with every termination but the active termination configured in the calibration standard 317. As explained above, these measurements serve to solve a system of equations for an error network that represents the transmission characteristics of the signal path.

The respective calibration parameters may then be used to adapt the test signal that is provided from the vector signal generator 316 to a DUT when a test or measurement is performed.

Figure 4:
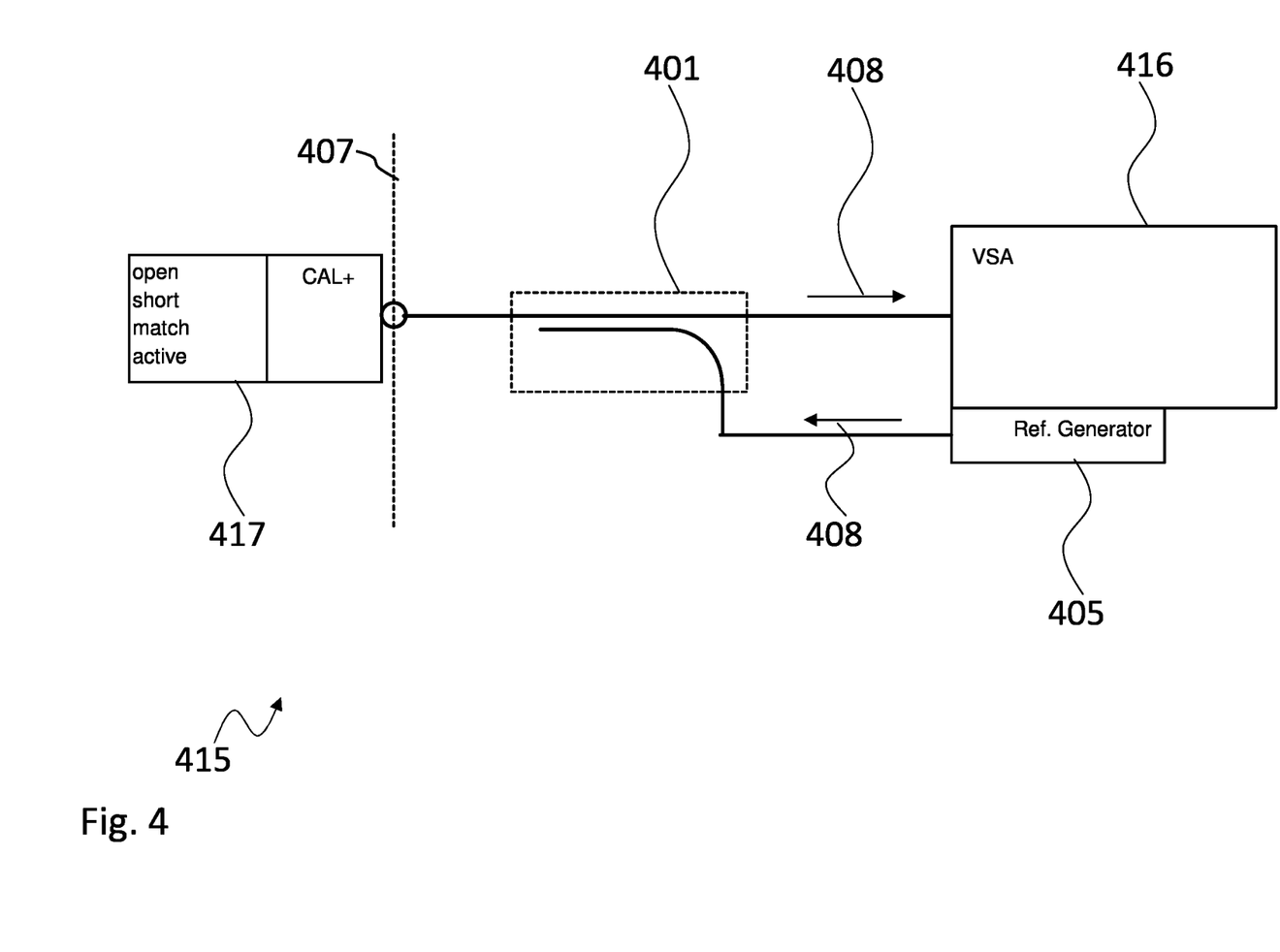
FIG. 4 shows a block diagram of an embodiment of another measurement system according to the present disclosure.

FIG. 4 shows a block diagram of a measurement system 415.

The measurement system 415 comprises a measurement application device calibration unit like the measurement application device calibration unit 200 with a coupling element 401 coupled into a measurement signal path and coupled to a reference generator 405 as signal processing device. The measurement signal path is arranged between a vector signal analyzer 416 as measurement application device and a reference plane 407. At the reference plane 407 the measurement system 415 comprises a calibration standard 417.

In the shown example, the calibration standard 417 may be an automatically switchable calibration standard 417 that may provide different terminations at the reference plane 407. The calibration standard 417 may provide an open termination, a short termination, a match termination, and an active termination. Of course, in other embodiments, dedicated calibration standards may be provided at least for some of the terminations, and other terminations than open, short and match may be used.

In an exemplary embodiment, the measurement signal path may be calibrated by first activating the active termination of the calibration standard 417. In this mode, the calibration standard 417 may acquire a predetermined known calibration signal 408 that may be provided by the reference generator 405. As explained above, in embodiments, the predetermined known calibration signal 408 may be a comb signal generated by a comb generator in the reference generator 405.

The known calibration signal 408 will then be received by the calibration standard 417 in the active termination mode, and may be evaluated to determine the transmission characteristics of the signal path from the reference generator 405 to the reference plane 407.

Since the characteristics of the known calibration signal 408 are known in detail, any deviation between the known calibration signal 408 as received by the calibration standard 417 and the original known calibration signal as it should be received may be determined. Based on the identified differences, the transmission characteristics of the signal path from the reference generator 405 to the reference plane 407 may be determined.

After performing this first calibration step, in a second calibration step, the signal path between the reference plane 407 and the vector signal analyzer 416 may be calibrated.

This calibration may be performed by generating a respective calibration signal 408 in the reference generator 405 and outputting the calibration signal 408 into the signal path via the coupling element 401. The calibration signal 408 will then be reflected at the reference plane 407 and will then be received by the vector signal analyzer 416.

Measurements for the second calibration may be performed with every termination, but the active termination configured in the calibration standard 417. As explained above, these measurements serve to solve a system of equations for an error network that represents the transmission characteristics of the signal path.

The respective calibration parameters may then be used to adapt the test signal that is received from the DUT in the vector signal analyzer 416 when a test or measurement is performed.

Figure 5:
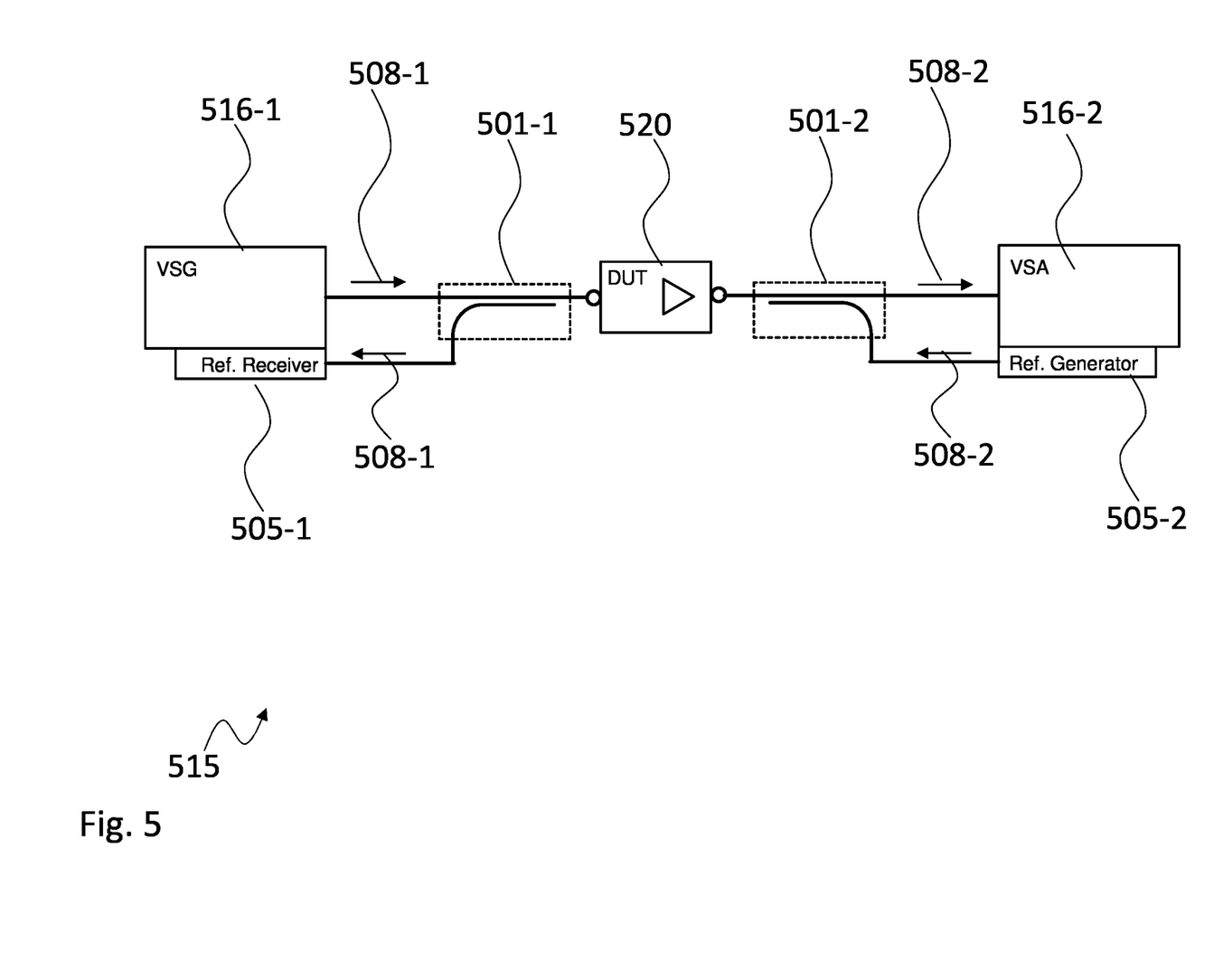
FIG. 5 shows a block diagram of an embodiment of another measurement system according to the present disclosure.

FIG. 5 shows a block diagram of another measurement system 515. The measurement system 515 comprises a DUT input side section, which is essentially equivalent to the measurement system 315, and a DUT output side section, which is essentially equivalent to the measurement system 415. Reference is, therefore, made to the description of FIGS. 3 and 4 at this point to prevent repetitions.

Instead of the calibration standards 317, 417, a DUT 520 is provided in the middle of the signal path between the vector signal generator 516-1 and the vector signal analyzer 516-1. It is understood, that prior to coupling the DUT 520 to the measurement system 515, the calibration of the signal paths may be performed as explained for the single measurement systems 315, 415.

When a test is to be performed with the DUT 520 after calibrating the measurement system 515, the vector signal generator 516-1 may generate the respective test signal and provide the test signal to the DUT 520. The vector signal analyzer 516-1 may then receive the test signal as it is output by the DUT 520 for further analysis.

Figure 6:
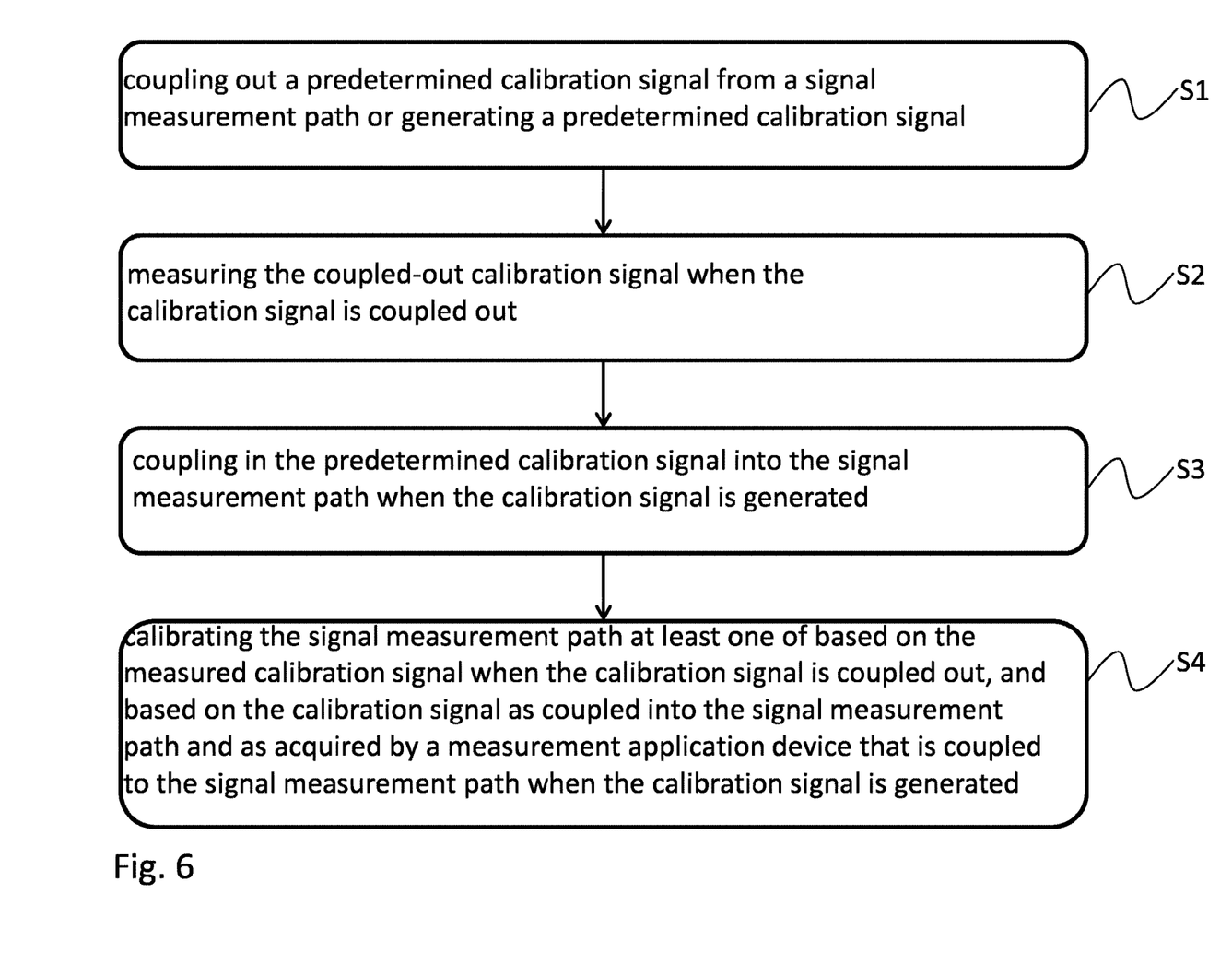
FIG. 6 shows a flow diagram of an embodiment of a method according to the present disclosure.

FIG. 6 shows a flow diagram of a method according to the present disclosure. The method comprises coupling out S1 a predetermined calibration signal from a signal measurement path or generating a predetermined calibration signal, measuring S2 the coupled-out calibration signal when the calibration signal is coupled out, coupling in S3 the predetermined calibration signal into the signal measurement path when the calibration signal is generated, and calibrating S4 the signal measurement path at least one of based on the measured calibration signal when the calibration signal is coupled out, and based on the calibration signal as coupled into the signal measurement path and as acquired by a measurement application device that is coupled to the signal measurement path when the calibration signal is generated.

Coupling out the calibration signal or coupling in the calibration signal may for example be performed with a coupling element according to the present disclosure.

Calibrating the signal measurement path may be performed in the measurement application device with a measurement signal generator that is coupled to the signal measurement path when the calibration signal is coupled out, and with a measurement signal receiver that is coupled to the signal measurement path when the calibration signal is coupled in. Calibrating may comprise determining a mismatch between a first impedance and a second impedance, wherein the first impedance comprises an impedance from the reference plane towards a device under test that may be coupled to the reference plane during a measurement, and wherein the second impedance comprises an impedance from the reference plane towards the measurement application device.

Calibrating may also further comprise determining S-parameters of an error network of the signal measurement path while or after three different calibration standards are consecutively coupled to the signal measurement path at the reference plane.

For calibrating the signal path between the reference plane and the signal processing device of the coupling element on the DUT input side, a predetermined known calibration signal may be generated and may be input into the signal path at the reference plane. A transmission parameter for the signal path from the reference plane to the point of measurement of the coupled-out calibration signal e.g., the signal processing device, may be determined based on the known calibration signal and stored information about the known calibration signal, wherein calibrating is performed additionally based on the transmission parameter.

For calibrating the signal path between the signal processing device and the reference plane of the coupling element on the DUT output side a predetermined known calibration signal may be received at the reference plane with an active calibration standard, wherein the known calibration signal is generated at the same point as the coupled-in calibration signal. A transmission parameter for the signal path from the point of generation of the coupled-in calibration signal to the reference plane may be determined based on the known calibration signal as received and stored information about the active calibration standard, wherein calibrating is performed additionally based on the transmission parameter.

Figure 7:
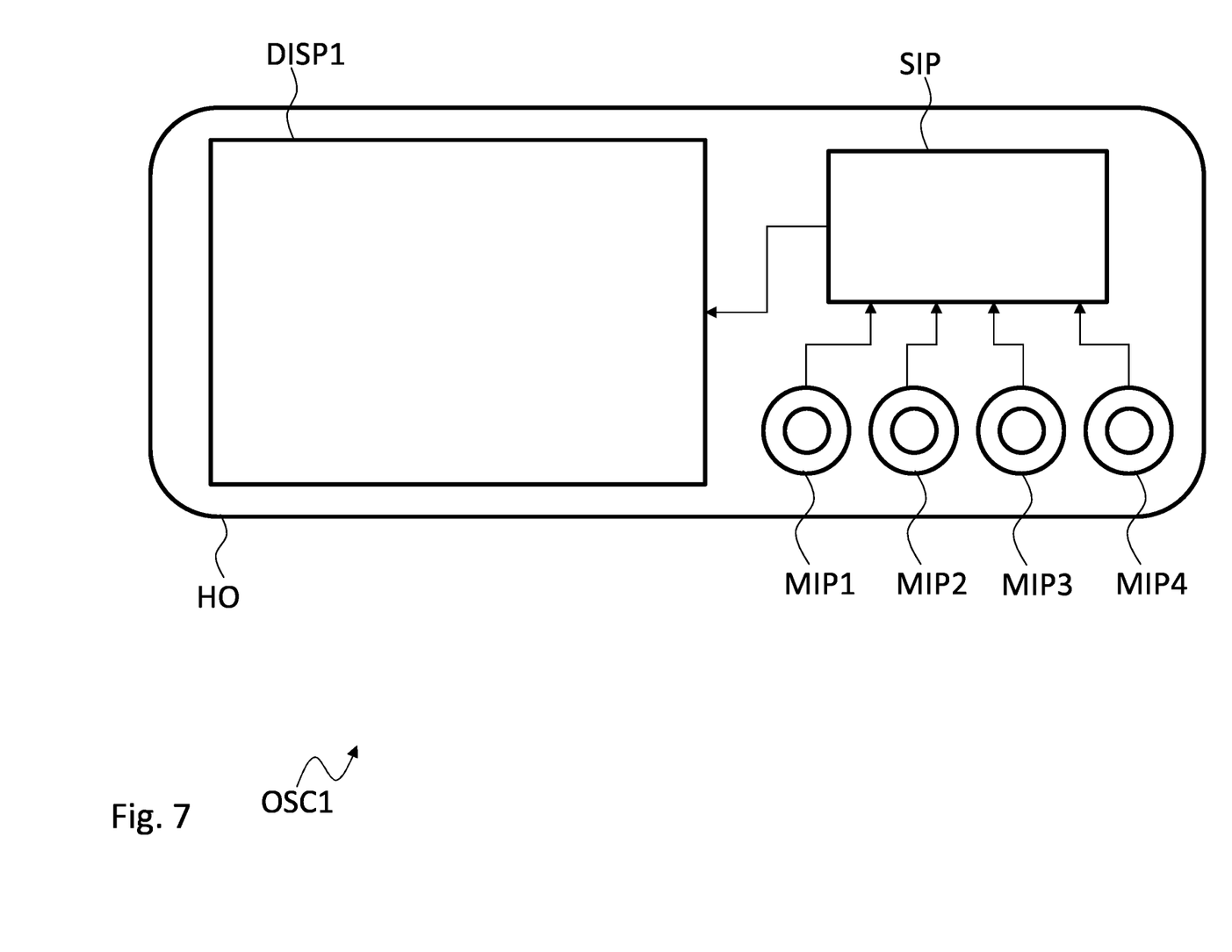
FIG. 7 shows a block diagram of an oscilloscope for use as an embodiment of a measurement application device according to the present disclosure.

FIG. 7 shows a block diagram of an oscilloscope OSC1 that may be used in an embodiment of a measurement system according to the present disclosure.

The oscilloscope OSC1 comprises a housing HO that accommodates four measurement inputs MIP1, MIP2, MIP3, MIP4 that are coupled to a signal processor SIP for processing any measured signals. The signal processor SIP is coupled to a display DISP1 for displaying the measured signals to a user. The shown oscilloscope OSC1 may be used for example, on the DUT output side as a measurement instrument.

In embodiments, the oscilloscope OSC1 may also comprise a signal generator and may be used on the DUT input side in a measurement system.

It is understood, that any calculations that need to be performed according to the present disclosure, may for example be performed by the signal processor SIP. In order to receive the required data at the signal processor SIP, the oscilloscope OSC1 may also comprise respective communication means that allow the oscilloscope OSC1 to communicate for example, with a reference receiver or a reference generator.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

LIST OF REFERENCE SIGNS 100, 200 measurement application device calibration unit
101, 201, 301, 401, 501-1, 501-2 coupling element 102, 202 first connection
103, 203 second connection
104, 204 third connection
105, 205, 305, 405, 505-1, 505-2 signal processing device
106, 206 connector
107, 207, 307, 407 reference plane
108, 208, 308, 408, 508-1, 508-2 calibration signal
109, 209 signal measurement path
315, 415, 515 measurement system
316, 416, 516-1, 516-2 measurement application device
317, 417 calibration standard
520 DUT
OSC1 oscilloscope
HO housing
MIP1, MIP2, MIP3, MIP4 measurement input
SIP signal processing
DISP1 display

What is claimed is:

1. A measurement application device calibration unit, comprising:
at least one coupling element comprising:
a first connection and a second connection for coupling the coupling element into a signal measurement path that is coupled to a measurement application device; and
a third connection;
wherein the coupling element is configured to at least one of couple out a signal from the signal measurement path into the third connection, and couple in a signal from the third connection into the signal measurement path; and
a signal processing device that is coupled to the third connection of the coupling element and that is configured:
to receive a predetermined calibration signal when the coupling element couples out a signal from the signal measurement path into the third connection; and
to generate the predetermined calibration signal when the coupling element couples in a signal from the third connection into the signal measurement path,
wherein the measurement application device is configured to calibrate the signal measurement path based on:
the calibration signal measured by the measurement application device calibration unit, or
the calibration signal as coupled into the signal measurement path and measured by the measurement application device;
wherein when calibrating the measurement application device is configured to determine a mismatch between a first impedance and a second impedance;
wherein the first impedance comprises an impedance from a reference plane towards a device under test, and wherein the second impedance comprises an impedance from the reference plane towards the measurement application device.

2. The measurement application device calibration unit of claim 1, wherein the signal processing device comprises:
a reference receiver when the coupling element couples out a signal from the signal measurement path into the third connection; and
a reference signal generator when the coupling element couples in a signal from the third connection into the signal measurement path.

3. A measurement system, comprising:
a measurement application device;
a signal measurement path from the measurement application device to a reference plane; and
a measurement application device calibration unit configured to at least one of couple out a predetermined calibration signal from the signal measurement path and measure the predetermined calibration signal, and generate a predetermined calibration signal and couple in the predetermined calibration signal into the signal measurement path;
wherein the measurement application device is configured to calibrate the signal measurement path based on:
the calibration signal measured by the measurement application device calibration unit, or
the calibration signal as coupled into the signal measurement path and measured by the measurement application device;
wherein when calibrating the measurement application device is configured to determine a mismatch between a first impedance and a second impedance;
wherein the first impedance comprises an impedance from the reference plane towards a device under test, and wherein the second impedance comprises an impedance from the reference plane towards the measurement application device.

4. The measurement system according to claim 3, wherein the measurement application device calibration unit comprises:
a coupling element comprising:
a first connection and a second connection for coupling the coupling element into the signal measurement path; and
a third connection;
wherein the coupling element is configured to at least one of couple out a signal from the signal measurement path into the third connection, and couple in a signal from the third connection into the signal measurement path; and
a signal processing device that is coupled to the third connection of the coupling element and that is configured:
to receive the calibration signal when the coupling element couples out a signal from the signal measurement path into the third connection; and
to generate a calibration signal when the coupling element couples in a signal from the third connection into the signal measurement path.

5. The measurement system according to claim 3, wherein the measurement application device comprises:
a measurement signal generator that is coupled to the signal measurement path when the measurement application device calibration unit couples out the predetermined calibration signal from the signal measurement path; and
a measurement signal receiver that is coupled to the signal measurement path when the measurement application device calibration unit couples in the predetermined calibration signal into the signal measurement path.

6. The measurement system according to claim 3, comprising three different calibration standards;
wherein the measurement application device is configured to determine S-parameters of an error network of the signal measurement path while the three different calibration standards are consecutively coupled to the signal measurement path at the reference plane.

7. The measurement system according to claim 6, wherein the measurement application device is configured to set one of the S-parameters to 1.

8. The measurement system according to claim 6, wherein the three different calibration standards comprise an open calibration standard, and a short calibration standard, and a matched calibration standard.

9. The measurement system according to claim 3, comprising an active calibration standard that is couplable to the reference plane and that is configured to generate a predetermined known calibration signal and input the known calibration signal into the signal path at the reference plane;
   wherein the measurement application device is configured to determine a transmission parameter for the signal path from the reference plane to the measurement application device calibration unit based on the known calibration signal and stored information about the known calibration signal; and
   wherein the measurement application device is configured to take into account the transmission parameter when calibrating the signal measurement path.

10. The measurement system according to claim 3, comprising an active calibration standard that is couplable to the reference plane and that is configured to receive a predetermined known calibration signal;
    wherein the measurement application device is configured to determine a transmission parameter for the signal path from the measurement application device calibration unit to the reference plane based on the known calibration signal as received by the active calibration standard and stored information about the active calibration standard; and
    wherein the measurement application device is configured to take into account the transmission parameter when calibrating the signal measurement path.

11. The measurement system according to claim 3, comprising:
    a first measurement application device calibration unit configured to couple out a predetermined calibration signal from the signal measurement path and measure the predetermined calibration signal;
    a first measurement application device configured to calibrate the signal measurement path based on the calibration signal measured by the measurement application device calibration unit;
    a second measurement application device calibration unit configured to generate a predetermined calibration signal and couple in the predetermined calibration signal into a second signal measurement path; and
    a second measurement application device configured to calibrate the second signal measurement path based on the calibration signal as coupled into the signal measurement path and measured by the measurement application device;
    wherein the first signal path is a DUT input-side signal path, and wherein the second signal path is a DUT output-side signal path.

12. A method, comprising:
    coupling out a predetermined calibration signal from a signal measurement path or generating a predetermined calibration signal;
    measuring the coupled-out calibration signal when the calibration signal is coupled out;
    coupling in the predetermined calibration signal into the signal measurement path when the calibration signal is generated; and
    calibrating the signal measurement path at least one of based on the measured calibration signal when the calibration signal is coupled out, and based on the calibration signal as coupled into the signal measurement path and as acquired by a measurement application device that is coupled to the signal measurement path when the calibration signal is generated;
    wherein calibrating comprises determining a mismatch between a first impedance and a second impedance; and
    wherein the first impedance comprises an impedance from a reference plane towards a device under test that may be coupled to the reference plane during a measurement, and wherein the second impedance comprises an impedance from the reference plane towards the measurement application device.

13. The method according to claim 12, wherein coupling out the calibration signal or coupling in the calibration signal is performed with a coupling element that comprises:
    a first connection and a second connection for coupling the coupling element into the signal measurement path; and
    a third connection;
    wherein the coupling element is configured to at least one of couple out a signal from the signal measurement path into the third connection, and couple in a signal from the third connection into the signal measurement path; and
    wherein measuring the coupled-out calibration signal and generating a predetermined calibration signal is performed with a signal processing device that is coupled to the third connection of the coupling element.

14. The method according to claim 12, wherein calibrating the signal measurement path is performed in the measurement application device with:
    a measurement signal generator that is coupled to the signal measurement path when the calibration signal is coupled out; and
    a measurement signal receiver that is coupled to the signal measurement path when the calibration signal is coupled in.

15. The method according to claim 12, further comprising determining S-parameters of an error network of the signal measurement path while three different calibration standards are consecutively coupled to the signal measurement path at the reference plane.

16. The method according to claim 12, further comprising generating a predetermined known calibration signal and inputting the known calibration signal into the signal path at the reference plane; and
    determining a transmission parameter for the signal path from the reference plane to the point of measurement of the coupled-out calibration signal based on the known calibration signal and stored information about the known calibration signal;
    wherein calibrating is performed additionally based on the transmission parameter.

17. The method according to claim 12, further comprising receiving a predetermined known calibration signal at the reference plane with an active calibration standard, wherein the known calibration signal is generated at the same point as the coupled-in calibration signal; and
    determining a transmission parameter for the signal path from the point of generation of the coupled-in calibration signal to the reference plane based on the known calibration signal as received and stored information about the active calibration standard;
    wherein calibrating is performed additionally based on the transmission parameter.

18. The method according to claim 12, comprising:
coupling out a predetermined first calibration signal from a first signal measurement path and measuring the first calibration signal;
calibrating the signal measurement path based on the measured first calibration signal;
generating a predetermined second calibration signal and coupling in the second calibration signal into a second signal measurement path; and
calibrating the second signal measurement path based on the second calibration signal as coupled into the signal measurement path and measured by the measurement application device;
wherein the first signal path is a DUT input-side signal path, and wherein the second signal path is a DUT output-side signal path.

* * * * *